(12) United States Patent
Dover

(10) Patent No.: US 7,577,028 B2
(45) Date of Patent: Aug. 18, 2009

(54) MEMORY STORAGE TECHNIQUE FOR A BI-DIRECTIONALLY PROGRAMMABLE MEMORY DEVICE

(75) Inventor: Lance W. Dover, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 220 days.

(21) Appl. No.: 11/690,709

(22) Filed: Mar. 23, 2007

(65) Prior Publication Data

US 2008/0232163 A1   Sep. 25, 2008

(51) Int. Cl.
*G11C 11/03* (2006.01)
(52) U.S. Cl. .......................... 365/185.03; 365/185.25; 365/189.06; 365/189.07; 365/189.08
(58) Field of Classification Search ............ 365/185.03, 365/185.09, 185.06, 185.25, 189.07, 189.08
See application file for complete search history.

(56) References Cited

U.S. PATENT DOCUMENTS

| 2008/0094893 A1* | 4/2008 | Choi ..................... 365/185.03 |
| 2008/0144380 A1* | 6/2008 | Youn et al. ............. 365/185.09 |

* cited by examiner

*Primary Examiner*—Pho M. Luu
(74) *Attorney, Agent, or Firm*—Trop, Pruner & Hu, P.C.

(57) ABSTRACT

A memory device includes a memory array with a programming region to store data. The programming region includes a plurality of memory cells and has an associated flag bit. Logic is coupled to the memory array. The logic is to compare data stored in the programming region to a desired programmed value, and to determine a number of changing bits. The logic may further set or clear the associated flag bit, depending on the number of changing bits.

18 Claims, 4 Drawing Sheets

MEMORY STORAGE TECHNIQUE FOR A BI-DIRECTIONALLY PROGRAMMABLE MEMORY DEVICE

BACKGROUND

A bi-directionally programmable memory device is one that uses the same technique to write either a "0" bit or a "1" bit to a memory cell. To program a bi-directionally programmable memory, the user simply writes the desired value to the memory, thus replacing the previous with the new contents. Thus, when n cells are programmed in this manner, between zero and n memory cells will change their values, depending on the current state and the desired state of those cells.

BRIEF DESCRIPTION OF THE DRAWINGS

A better understanding of embodiments of the present invention can be obtained from the following detailed description in conjunction with the following drawings, in which.

DETAILED DESCRIPTION

Figure 1:
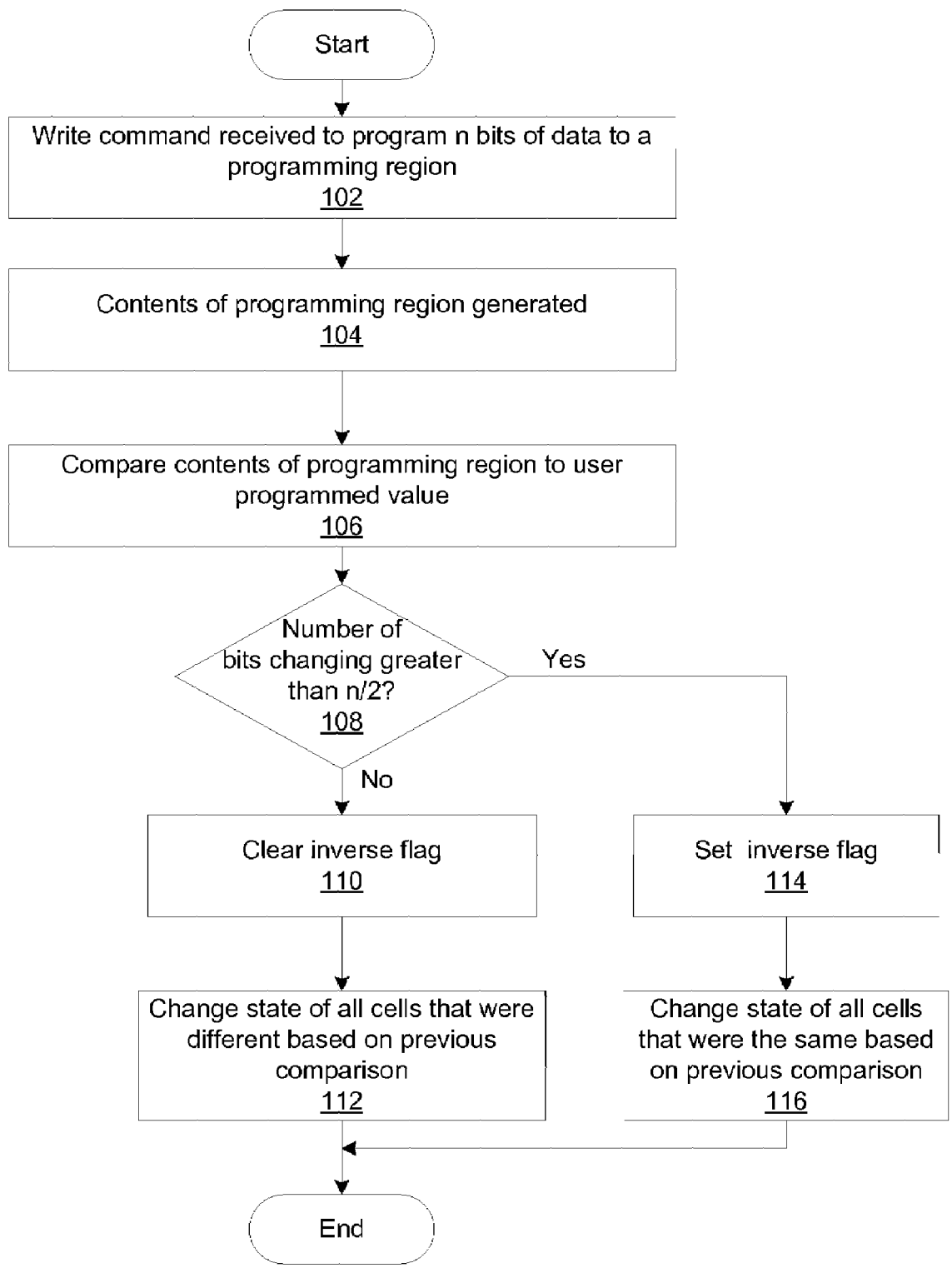
FIG. 1 is a flow diagram illustrating a write operation according to some embodiments.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiments) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a machine-readable medium, which may be read and executed by one or more processors to enable performance of the operations described herein. A machine-readable medium may include any mechanism for storing, transmitting, and/or receiving information in a form readable by a machine (e.g., a computer). For example, a machine-readable medium may include a storage medium, such as but not limited to read only memory (ROM); random access memory (RAM); magnetic disk storage media; optical storage media; a flash memory device, etc. A machine-readable medium may also include a propagated signal which has been modulated to encode the instructions, such as but not limited to electromagnetic, optical, or acoustical carrier wave signals.

The term "wireless" and its derivatives may be used to describe circuits, devices, systems, methods, techniques, communications channels, etc., that communicate data by using modulated electromagnetic radiation through a non-solid medium. The term does not imply that the associated devices do not contain any wires, although in some embodiments they might not. The term "mobile wireless device" is used to describe a wireless device that may be in motion while it is communicating.

Embodiments described herein may be practiced using any type of bi-directionally programmable memory. A bi-directionally programmable memory device is one that uses the same technique to write either a "0" bit or a "1" bit to a memory cell. Examples of bi-directionally programmable memory may include, but are not limited to, phase change memory (PCM), electrically erasable programmable read only memory (EEPROM), and magnetic random access memory (MRAM).

FIG. 1 is a flow diagram illustrating a write operation for a bi-directionally programmable memory device according to some embodiments. A user may program n bits of data to an n-cell programming region within a memory device (102). The programming region includes a plurality of memory cells. A memory device may include one or more programming regions.

When a write command is received by a memory device to write n bits of data to a programming region, as in block 102, the existing contents of the programming region may be generated by the memory device (104). The existing contents of the programming region are then compared to the value that is to be programmed in the programming region (106).

Based on the results of the comparison of block 106, a determination is made whether the number of cells in the programming region that will be changing is greater than n/2 (108).

If more than half of the cells in the programming region will be changing based on the comparison between the existing contents of the programming region (104) and the user programmed bits (102), an inverse flag associated with the programming region may be set (114). The inverse flag may be set, for example, by programming a "1" to a bit that is associated with the programming region. In another embodiment, the inverse flag may be set, for example, by programming a "0" to a bit that is associated with the programming region.

To program the n bits of user data to the programming region, the state of all corresponding cells that were the same based on the previous comparison (106) will be changed (116). For example, if bit 0 of the data to be programmed matches corresponding bit 0 of the programming region (e.g., both bits are "1"), bit 0 of the programming region will be inverted (e.g., bit 0 will be programmed to a value of "0"). Thus, less than n/2 bits of data may be programmed in the programming region. After the write operation has completed (116), the programming region will contain the inverse of the data programmed by the user.

If less than or equal to half of the bits in the programming region will be changing based on the comparison between the existing contents of the programming region (104) and the user programmed bits (102), the inverse flag associated with the programming region may be cleared (110). To program the n bits of user data to the programming region, all cells that were different based on the previous comparison (106) will change state (112). Thus, less than or equal to n/2 bits of data will be programmed in the programming region. After programming has occurred (112), the programming region will contain the data value programmed by the user.

Figure 2:
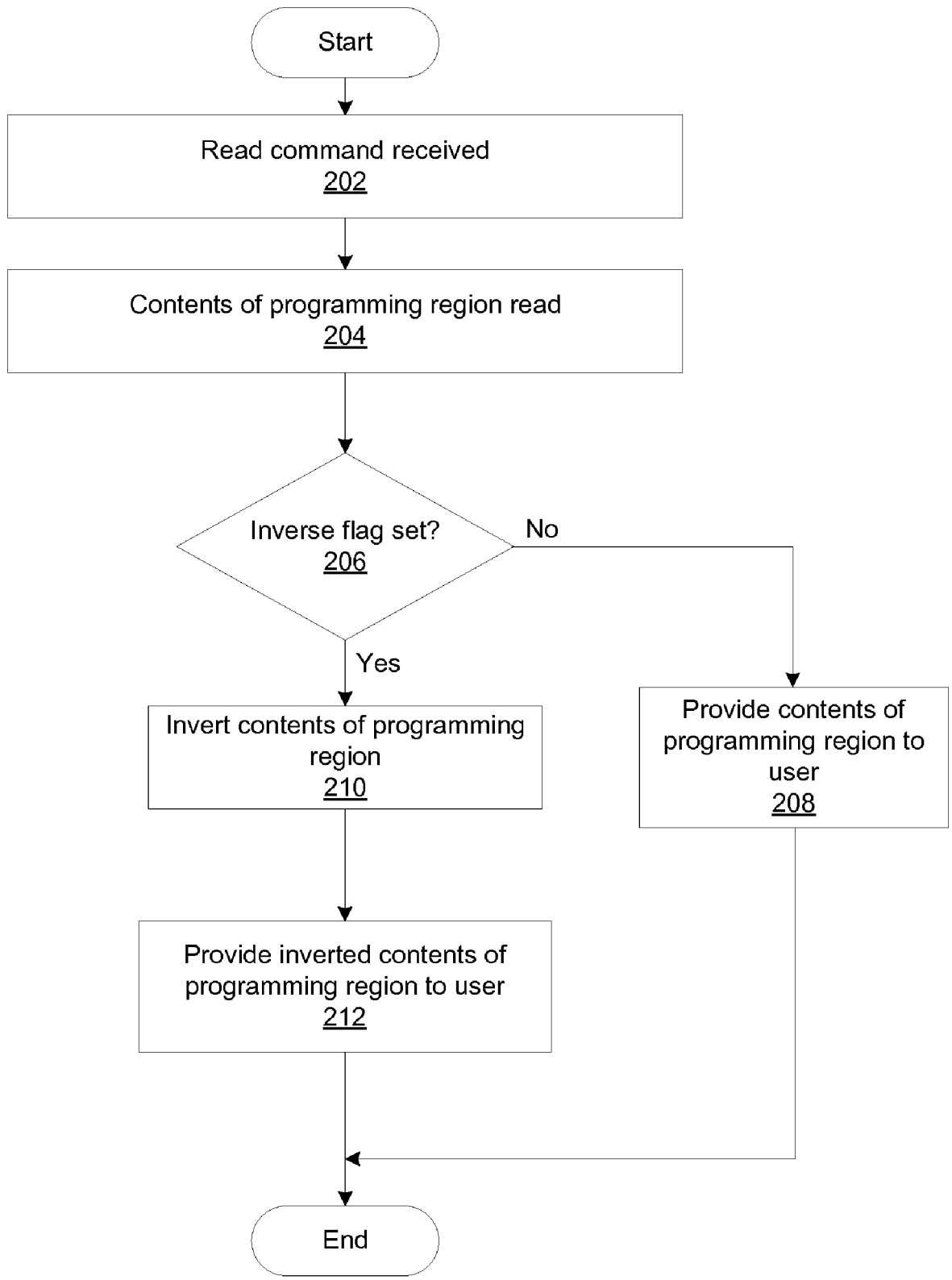
FIG. 2 is a flow diagram illustrating a read operation according to some embodiments.

FIG. 2 is a flow diagram illustrating a read operation according to some embodiments. A user may read data from a programming region within a memory device (202) by issuing a read command that is received at the memory device.

When a read command is received, the contents of the programming region are read (204), and the status of the inverse flag is read to determine if it is set (206). If the inverse flag is not set, this indicates that the contents of the programming region are the bits that were previously written to the programming region. The contents of the programming region may be provided to the user (208) without further processing.

If the inverse flag is set, this indicates that the contents of the programming region are the inverse of the bits that were previously written to the programming region. In this case, logic will invert the contents of the programming region (210). Inverting the contents of the programming region may be performed by logic within a memory device, and may not affect the logical state of cells within the programming region. The inverted contents of the programming region will be provided to the user (212).

Figure 3:
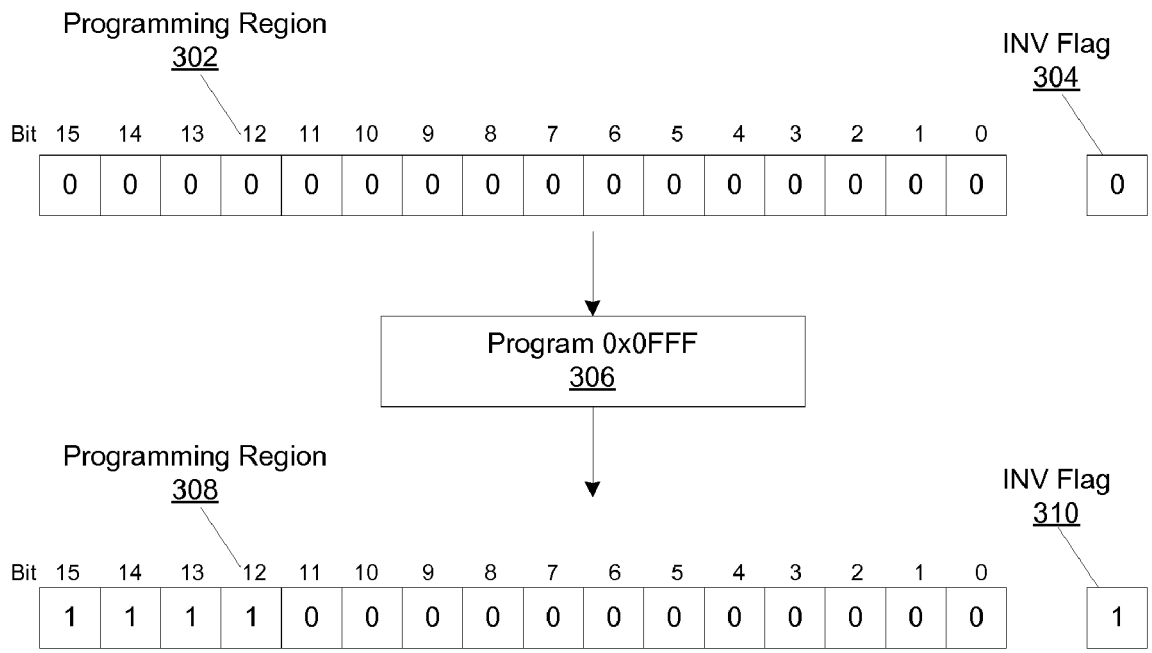
FIG. 3 is an illustration of a programming region before and after a write operation according to some embodiments.
Figure 4:
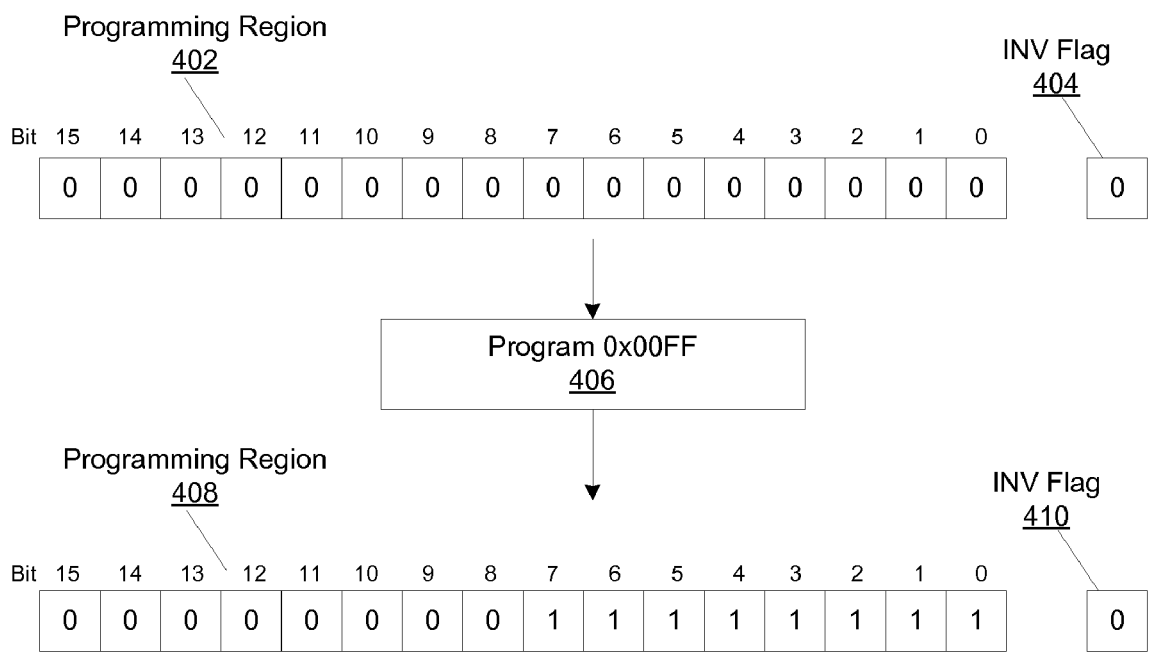
FIG. 4 is an illustration of a programming region before and after a write operation according to some embodiments.

FIGS. 3 and 4 illustrate a programming region before and after a program operation according to some embodiments. For ease of understanding, FIGS. 3 and 4 and the corresponding description will assume that a programming region includes n=16 cells. However, it should be noted that a programming region may include more or fewer cells, and that not all programming regions within a memory array must include the same number of cells.

FIG. 3 illustrates a programming region (302) that contains a value of 0x0000. The inverse (INV) flag associated with the programming region is not set (304). A value of 0x0FFF is desired to be written to the programming region (306). The desired value (306) is compared to the contents of the programming region (302) to determine how many bits are different, and which bits are different. In this example, 12 of the 16 bits are different (bits [11:0]) while 4 of the 16 bits will remain the same (bits [15:12]). Greater than half of the bits will change between the existing data (302) and the data to be written (306), thus the INV flag may be set (310). All cells that match and are the same based on the comparison (e.g., bits [15:12]) must change state. Thus, after the write operation is complete, the programming region will contain the inverse (308) of the programmed data (306), and the INV flag will be set (310).

Thus, although 12 bits differ between the existing data and the programmed data, only 5 bits must be programmed: four bits in the programming region plus the INV bit. This reduction in the number of cells programmed may reduce the required cell current for the memory device. In some embodiments, the reduction in the number of cells programmed may also improve programming performance.

When the programming region (308) is read, the set INV flag (310) will indicate that the programming region contains the inverse of the previously written data (306). The data will be read from the programming region and inverted, in order to provide a value of 0x0FFF to the user. It should be noted that the inversion of the contents of the programming region may occur after the contents are read, and may not affect the logical state of the cells within the programming region. That is, when programming region 308 is read, a value of 0x0FFF will be returned while the programming region's cells may remain programmed to 0xF000.

In a best case scenario, according to some embodiments, if a value of 0x0000 is currently stored in a 16-cell programming region, and 0xFFFF is to be written to the programming region, only one cell, the INV flag, will require programming. No cells in the programming region are the same as the desired value, thus no cells in the programming region must change state. Therefore, the number of cells requiring programming may be reduced from 16 to 1.

FIG. 4 illustrates another programming scenario, according to some embodiments. In this case, a value of 0x0000 is currently stored in a 16-cell programming region (402), and 0x00FF is to be written to the programming region (406). Initially, the INV bit may not be set (404). Since the number of bits changing, 8, is equal to n=16/2, all 8 changing bits will be programmed (408), and the INV flag will not be set (410). Thus, the greatest number of bits requiring programming may be equal to n/2.

If the INV flag for the programming region was previously set, it may be necessary to clear the flag if the number of bits changing is less than or equal to n/2.

According to some embodiments, storing the inverse of user programmed data when more than n/2 bits in a programming region are changing may approximately halve the number of cells that are programmed with each programming operation. This may reduce overall cell current or lower the overall programming current for the memory device.

Figure 5:
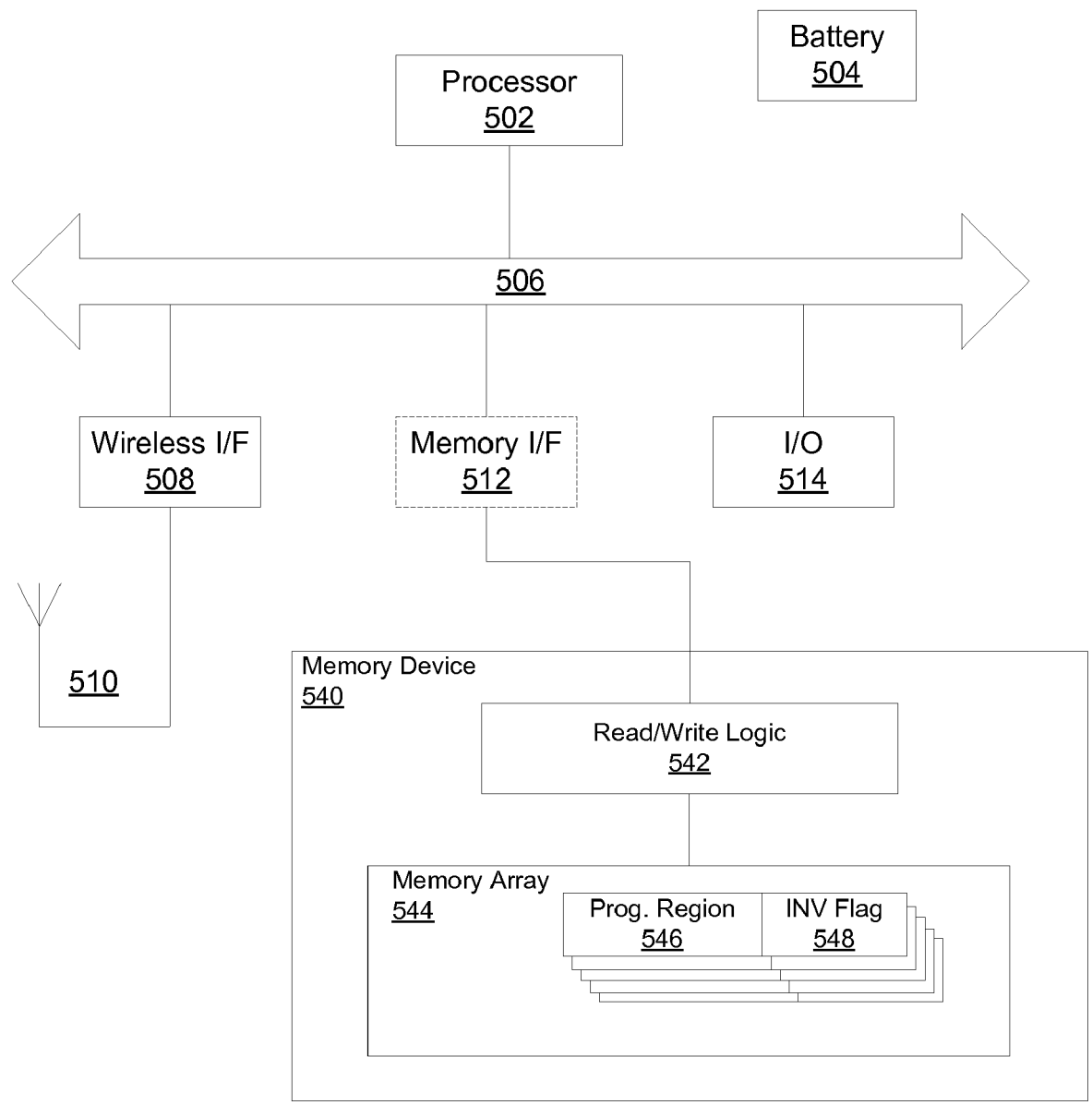
FIG. 5 is a block diagram of a system according to some embodiments.

FIG. 5 is a block diagram of a system according to one embodiment. In some embodiments, the system may be a mobile wireless device.

The system may include a controller (502) which communicates via an interconnect (506). The controller (502) may be a microcontroller, one or more microprocessors, each of which may include one or more cores, a digital signal processor (DSP), or another type of controller. The system may be powered by a battery (504) or may be powered with another power source, such as AC power.

A variety of input/output (I/O) devices (514) may be coupled to the interconnect (506). The I/O devices may include items such as a display, keyboard, mouse, touch screen, or other I/O devices. A wireless network interface (508) including an antenna (510) may also be coupled to the interconnect (506). The wireless interface (508) may enable cellular or other wireless communication between the system and other devices. In one embodiment, the antenna (510) may be a dipole antenna.

The system also includes a bi-directionally programmable memory device (540), such as, but not limited to, a phase change memory device, an EEPROM, or an MRAM device. The memory device may be built into the system, or may be part of a removable storage medium, such as a card form factor, that may be inserted into an optional card interface (512) or other type of interface.

The memory device (540) may include read/write logic (542) coupled to a memory array (544). The memory array (544) includes a plurality of programming regions (546). Each programming region (546) has an associated inverse (INV) flag (548). In some embodiments, the INV flag may be a single bit within the memory array (544). The memory device (540) may include other elements as well, however, those are not illustrated here for ease of understanding.

In some embodiments, the read/write logic (542) may generate the contents of a programming region, compare the contents of a programming region to a user programmed value, determine the number of bits that are to change between the programming region's value and the desired programmed value, and based on the number of changing bits, setting or clearing the inverse flag for the programming region as appropriate, and changing the state of the appropriate cells in the programming region, as described above with respect to FIG. 1.

The read/write logic (542) may further read the contents of a programming region, determine whether the inverse flag is set, and provide the appropriate read data to the user, depending on whether the inverse flag is set, as described above with respect to FIG. 2.

Thus, a memory storage technique for a bi-directionally programmable memory device is disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

I claim:

1. A memory device, comprising:
   a memory array including a programming region to store data, the programming region including a plurality of memory cells and having an associated flag bit; and
   logic coupled to the memory array, the logic to compare a programming state of cells in said programming region to a desired programmed value of said cells, and to determine how many cells in the programming region are in a state different than said desired programmed value.

2. The memory device of claim 1, wherein if the number of changing bits is greater than half of the plurality of memory cells in the programming region, the logic is further to set the associated flag bit.

3. The memory device of claim 2, wherein the logic is further to invert each of the plurality of memory cells within the programming region that matches a corresponding bit in the desired programmed value.

4. The memory device of claim 3, wherein the logic is further to read the data from the programming region in response to a read request, to determine if the associated flag bit is set, and if the associated flag bit is set, to invert the data read the programming region.

5. The memory device of claim 1, wherein if the number of changing bits is less than or equal to half of the plurality of memory cells in the programming region, the logic is further to invert each of the plurality of memory cells within the programming region that is different from a corresponding bit in the desired programmed value.

6. The memory device of claim 5, wherein the logic is further to read the data from the programming region in response to a read request, to determine if the associated flag bit is set, and if the associated flag bit is not set, to provide the data read from the programming region.

7. A method comprising:
   receiving a write command to program a plurality of bits of data to a programming region, wherein the programming region includes a plurality of cells;
   generating current contents of the programming region; and
   comparing the current contents of the programming region to the plurality of bits of data; and
   determining a number of changing bits based on said comparison.

8. The method of claim 7, further comprising setting a flag associated with the programming region if the number of changing bits is greater than half of the plurality of bits of data.

9. The method of claim 8, further comprising inverting each of the plurality of cells that matches a corresponding bit in the plurality of bits of data.

10. The method of claim 7, further comprising clearing a flag associated with the programming region if the number of changing bits is less than or equal to half of the plurality of bits of data.

11. The method of claim 10, further comprising inverting each of the plurality of cells that is different than a corresponding bit in the plurality of bits of data.

12. The method of claim 7, further comprising receiving a read command; reading data from the programming region, and reading a flag associated with the programming region.

13. The method of claim 12, wherein if the flag associated with the programming region is set, inverting the data read from the programming region.

14. The method of claim 12, wherein if the flag associated with the programming region is cleared, providing the contents of the programming region.

15. A system comprising:
   an interconnect;
   a processor coupled to the interconnect;
   a wireless interface coupled to the interconnect; and
   a memory device coupled to the interconnect, wherein the memory device includes a memory array including a programming region having an associated flag bit and logic coupled to the memory array, the logic to compare data stored in the programming region to a desired programmed value and to determine a number of changing bits, wherein the programming region includes a plurality of cells to store data.

16. The system of claim 15, wherein the memory device is a phase change memory device.

17. The system of claim 15, wherein if the number of changing bits is greater than half of the plurality of cells in the programming region, the logic is further to set the associated flag bit and to invert each of the plurality of cells within the programming region that matches a corresponding bit in the desired programmed value.

18. The system of claim 15, wherein if the number of changing bits is less than or equal to half of the plurality of cells in the programming region, the logic is further to clear the associated flag bit and to invert each of the plurality of memory cells within the programming region that is different from a corresponding bit in the desired programmed value.

* * * * *